United States Patent [19]

Hukuda

[11] Patent Number: 5,017,861
[45] Date of Patent: May 21, 1991

[54] METER DRIVING APPARATUS

[75] Inventor: Kazuyuki Hukuda, Kyoto, Japan

[73] Assignee: Rohm Co., Ltd., Kyoto, Japan

[21] Appl. No.: 436,648

[22] Filed: Nov. 15, 1989

[30] Foreign Application Priority Data

Nov. 24, 1988 [JP] Japan ............................... 63-296604

[51] Int. Cl.$^5$ ...................... G01R 11/36; G01R 11/30
[52] U.S. Cl. .................................... 324/143; 324/166; 324/140 R
[58] Field of Search ............... 324/143, 140 R, 140 D, 324/144, 146, 151 R, 151 A, 154 R, 166, 167

[56] References Cited

U.S. PATENT DOCUMENTS

| 3,801,906 | 4/1974 | Harris | 324/78 D |
| 4,827,209 | 5/1989 | Tanaka et al. | 324/143 |
| 4,928,060 | 5/1990 | Ito | 324/143 |

Primary Examiner—Kenneth Wieder
Assistant Examiner—Robert W. Mueller
Attorney, Agent, or Firm—Oliff & Berridge

[57] ABSTRACT

A meter driving apparatus used for automotive meters such as a tachometer and a speedometer. The frequency of a pulse signal the period of which changes in correspondence with an input is calculated by counting the reference clock signals. A current corresponding to the calculated frequency is applied to two exciting coils which are orthogonal to each other, and the indicator points at the direction at the angle determined by the torque received in accordance with the magnetic field generated. A time counter adds one to the current count value whenever a predetermined time has elapsed. Even when the input pulse signal has a low frequency and the frequency rapidly changes from a high value to a low value, a temporary output is calculated from the current count value so as to prevent the degradation of the responsiveness. When the difference between the calculated frequency and the precedent frequency is large, the difference is changed into a predetermined value intermediate between the precedent value and the calculated value, thereby enabling smooth movement of the indicator which point the value in the meter in correspondence with the change in the input.

6 Claims, 3 Drawing Sheets

METER DRIVING APPARATUS

BACKGROUND OF THE INVENTION

1. Field of the Invention

The present invention relates to a meter driving apparatus used for automotive meters such as a tachometer and a speedometer.

2. Description of the Prior Art

A general automotive speedometer is provided with a magnet M for swinging an indicator in the magnetic field formed by two orthogonal coils $L_s$ and $L_c$, as shown in FIG. 3. The current corresponding to an input such as speed is applied to the coils $L_s$ and $L_c$ so as to rotate the magnet M, thereby swinging the indicator. In a meter driving apparatus for a speedometer of this kind, a pulse signal the period of which changes in correspondence with an input, namely, speed is input as well as a clock signal generated by a reference clock generator, the clock signals of a counter are first counted for one period of the pulse signal so as to obtain the period T of the pulse signal, and the frequency f is calculated from $f=1/T$ on the basis of the thus-obtained period T. Since this digital data f is proportional to the input, the current corresponding to the digital value f is applied to the coils $L_s$ and $L_c$, and the magnetic field generated by the coils $L_s$ and $L_c$ rotates the indicator, which is the magnet, to the direction at an angle determined by the digital value f.

The above-described conventional meter driving apparatus has the following problems. Since the frequency of a pulse signal is obtained by calculating the period of the pulse signal which changes with speed on the basis of the count value of clock signals and the direction is determined by an angle determined by the digital value converted from the frequency by the sin and cos calculations, for example, when the input is rapidly changed from a high speed to a low speed, the frequency of the input pulse signal is also changed from a high frequency to a low frequency and the period becomes long. It takes a long time for the indicator to point in a new direction because the frequency after the change is not calculated and, hence, the indicator does not move until the clock signals for one period are counted. Thus, the responsiveness of the speedometer is very bad.

In addition, since the indicator is swung by the current applied to the orthogonal coils in correspondence with the input by the sin and cos calculations of the frequency, namely, the digital data, for example, when the indicator is rapidly changed from the speed of 145 km/H to the speed of 25 km/H, as shown in FIG. 4, the indicator sometimes swings not in the direction A but in the direction of B in which the values are higher in spite of the actual change from a high speed to a low speed, and overruns the measurable range.

SUMMARY OF THE INVENTION

Accordingly, it is an object of the present invention to eliminate the above-described problems in the prior art and to provide a meter driving apparatus which does not lower the response speed even when the input is small, and in which the indicator swings naturally.

To achieve this aim, a meter driving apparatus according to the present invention is provided with first and second coils which are orthogonal to each other; a means for inputting a pulse signal having a frequency corresponding to an input; a clock signal generator; a calculator for calculating the digital value which is proportional to the input on the basis of the count value obtained by counting the clock signals of the clock signal generating means; drivers for applying the currents corresponding to the digital values output from the calculator to the first and second coils, respectively; and an indicator pointing the value which is proportional to the input by the direction at the angle determined by the magnetic field generated by the currents flowing on the first and second coils. The calculator is provided with a time counter for adding one to the current count value whenever a predetermined time has elapsed; a period change detecting means for detecting a change of the period of the pulse signal; a memory for storing the contents of the time counter in response to the detection of a change of the period or the increase in the count value of the time counter; a calculator for calculating the digital value which is proportional to the input on the basis of the contents of the memory whenever the count value of the time counter increases; a difference calculator for calculating the difference between the current digital value and the precedent digital value; a decision circuit for judging whether or not the digital value has been calculated on the basis of the stored data at the time of detection of a change of the period; a difference polarity decision circuit for judging whether the difference is positive or negative when the answer of the decision circuit is NO and finishing the processing if the difference is positive; a difference value decision circuit for judging whether or not the absolute value of the difference is not less than a predetermine value when the answer of the decision circuit is YES or when the difference is positive at the difference decision circuit; an output decision circuit for deciding a predetermined value between the current digital value and the precedent digital value as the output digital value when the absolute value of the difference is not less than the predetermined value, and deciding the current digital value as the output digital value when the difference is less than the predetermined value.

In the meter driving apparatus, the count value of the time counter is stored in the memory when the period of the input pulse is changed and the change of the period is detected, or when the count value of the time counter increases before the detection of a change in the period. The digital value which is proportional to the input is calculated on the basis of the count data stored in the memory whenever the count value of the time counter increases. The difference between the current digital value and the precedent digital value is calculated by the difference calculator, and judgement is made as to whether or not the digital calculation has been based on the stored data at the time of the detection of a change of the period.

When the input is comparatively large, in other words, when the speed is high, one period of the input pulse signal terminates before a predetermined time elapses, so that the answer of judgement in this case is NO. On the other hand, when the input is smaller than a predetermined value, in other words, when the speed is low, a predetermined time elapses before one period of the input pulse signal terminates. In this case, the difference polarity decision circuit judges whether the difference is positive or not. Since the current digital value is counted on the basis of the count value before all the clock signals for one period are counted, the digital value obtained is slightly larger than the true frequency. Therefore, when the difference is positive, the difference is disregarded and the processing is finished. On the other hand, when the difference is negative, since the digital value output is smaller than the true frequency, it cannot be disregarded. Accordingly, in this case and when the answer of judgement is NO, the difference value decision circuit judges whether or not the absolute value of the difference exceeds a predetermined value. When the absolute value of the difference is smaller than the predetermined value, the variance is regarded as small and the current digital value is output as it is. On the other hand, when the absolute value exceeds the predetermined value, the variance is regarded as large, so that the current value is not output as it is but a predetermined value between the precedent value and the current value, for example, the value obtained by adding ⅛ of the difference to the precedent value is output, thereby preventing the indicator from rapidly swinging.

The above and other objects, features and advantages of the present invention will become clear from the following description of the preferred embodiment thereof, taken in conjunction with the accompanying drawings.

BRIEF DESCRIPTION OF THE DRAWINGS

FIG. 2 is a schematic block diagram of an embodiment of a meter driving apparatus;

DESCRIPTION OF THE PREFERRED EMBODIMENT

The present invention will be explained in more detail hereinunder with reference to an embodiment.

Figure 2:
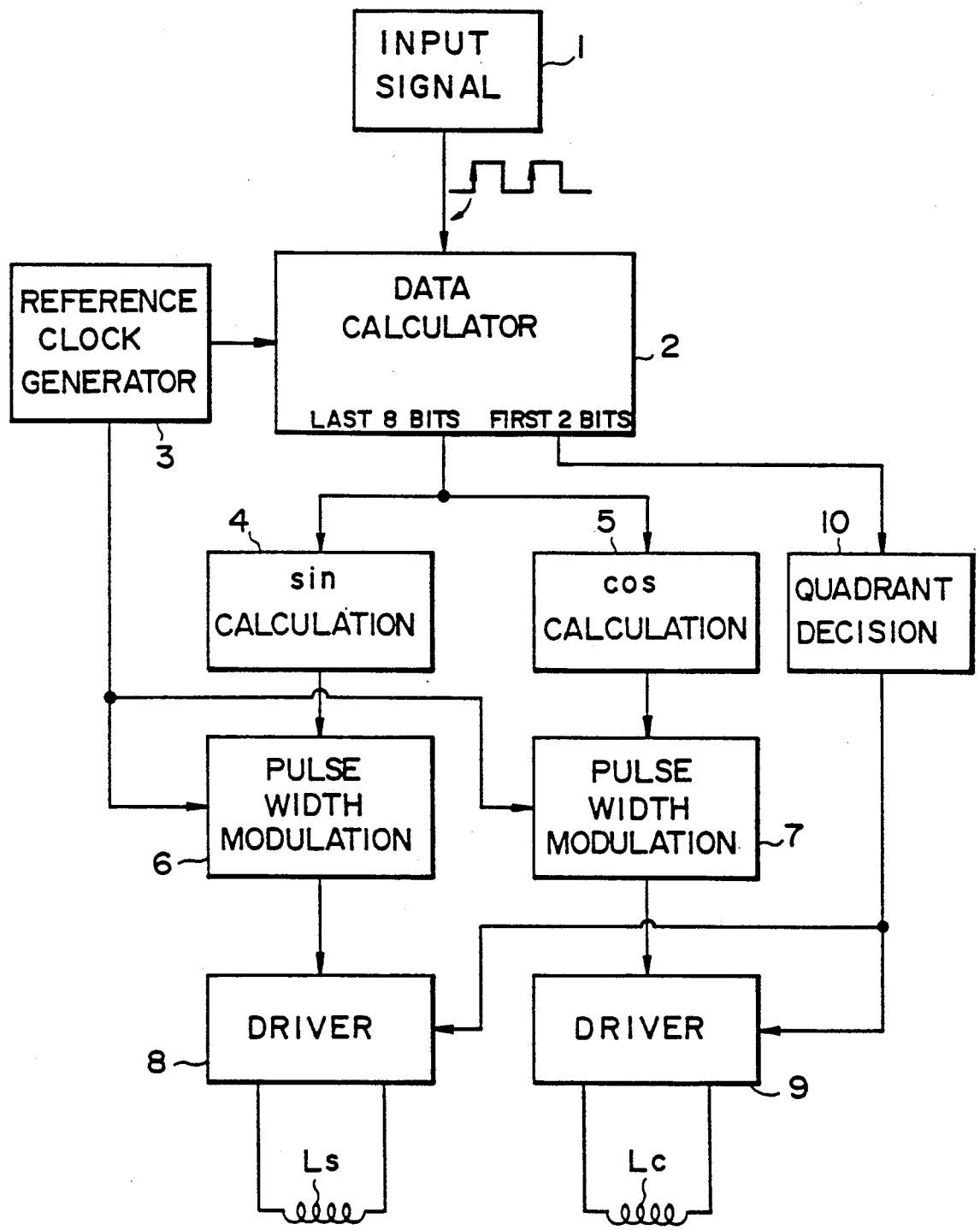
FIG. 2 is a block diagram of the functional structure of the data calculator of a meter driving apparatus according to the present invention.
Figure 3:
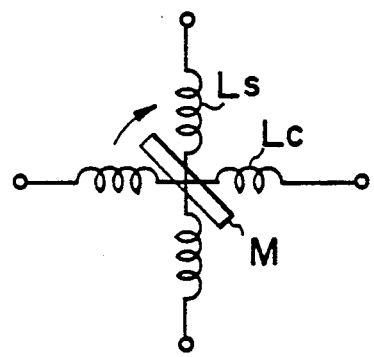
FIG. 3 shows the relationship between the two coils and the indicator connected to the meter driving apparatus of the embodiment shown in FIG. 2.
Figure 4:
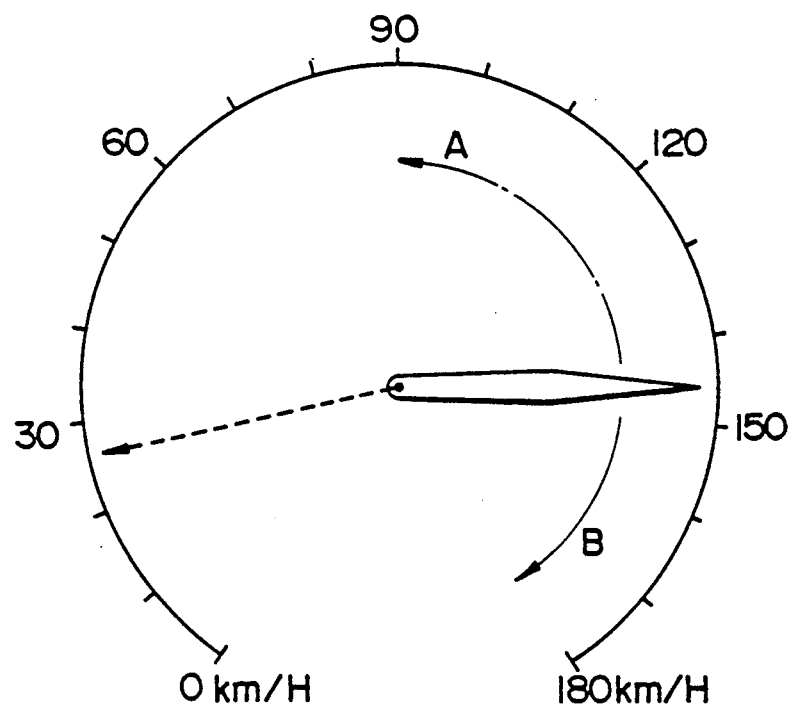
FIG. 4 is an explanatory view of the inconvenience of a conventional meter driving apparatus.

FIG. 2 is a block diagram of a meter driving apparatus according to the present invention. In FIG. 2, an input signal circuit 1 inputs a pulse signal which is generated in synchronization with the rotation of a wheel to a data calculator 2. A clock signal from a reference clock signal generator 3 is also input to the data calculator 2.

Figure 1:
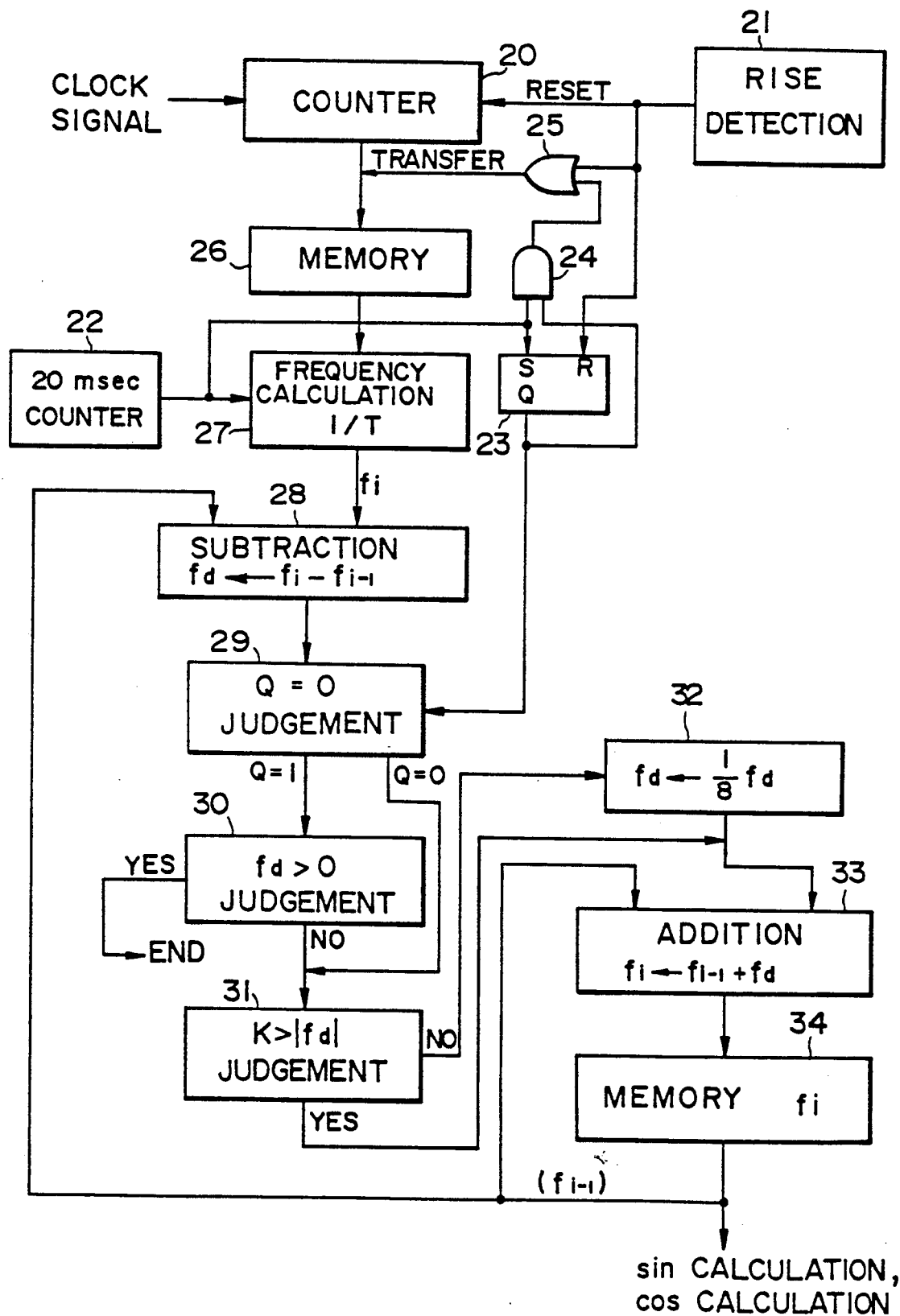

As shown in FIG. 1, the data calculator 2 is provided with a counter 20 for counting clock signals, a rise detection circuit 21 for detecting the rise (a change of the period) of a pulse signal and generating a transfer signal and a reset signal, a counter 22 for adding one to the current count value whenever 20 msec has elapsed, a flip flop 23 which is set in response to a count signal from the counter 22 and reset in response to the reset signal, an AND circuit 24 for outputting a transfer signal when the count signal is received in the state in which the flip flop 23 is set, an OR circuit 25 for supplying the output of the AND circuit 24 or the transfer signal from the rise detection signal 21 to the counter 20, a memory 26 for storing the count value whenever it receives the transfer signal, a frequency calculator 27 for calculating 1/T, namely, the frequency on the basis of the count value T stored in the memory 26 whenever the count value of the counter 22 increases, a subtracter 28 for subtracting the precedent frequency $f_{i-1}$ from the current frequency $f_i$ to obtain the difference $f_d$, a decision circuit 29 for judging the set/reset state of the flip flop 23 at the point of time the difference $f_d$ has been calculated, and a decision circuit 30 for judging whether or not the difference $f_d$ is not less than 0 when the set state of the flip flop 23 is judged. When the reset state of the flip flop 23 is ascertained by the decision circuit 29, the judging step by the decision circuit 30 is skipped.

The data calculator 2 is further provided with a decision circuit 31 for judging whether or not the absolute value of the difference $f_d$ is not less than a predetermined value K if the decision circuit 30 denies that $f_d > 0$, in other words, judges that $f_i < f_{i-1}$, and the decision circuit 29 judges that Q=0 (reset state), a difference renewing circuit 32 for reducing the absolute value of the difference $f_d$ to ⅛ $f_d$ when the decision circuit 31 denies that $K > |f_d|$ and skipping the renewing step when the decision circuit 31 judges that $K > |f_d|$, an adder 33 for adding the difference $f_d$ to the precedent frequency $f_{i-1}$, and a memory 34 for storing the added value $f_i$ outputting the added value $f_i$ as the current frequency $f_i$.

The frequency data $f_i$ output from the memory 34 of the data calculator 2 is a digital data of 10 bits. The circumference of the meter is divided into four quadrants and a quadrant decision means 10 determines to which quadrant the indicator to be swung belongs on the basis of the first 2 bits of the digital data. The quadrant decision circuit 10 outputs a direction signal determined by the thus-decided quadrant. The last 8 bits are data corresponding to 0° to 90° in each quadrant, and these data are input to a sin calculator 4 and a cos calculator 5 for the respective calculations. The respective results are input to drivers 8 and 9 through pulse width modulators 6 and 7, respectively. The driver 8 applies to a coil $L_s$ the current having the value corresponding to the signal from the sin calculator 4 and the polarity corresponding to the direction signal, and the driver 9 applies to a coil $L_c$ the current having the value corresponding to the signal from the cos calculator 5 and the polarity corresponding to the direction signal. The currents applied to the coils $L_s$ and $L_c$ generate a synthetic magnetic field, which swings the indicator so as to point the direction at the angle corresponding to the input.

The operation of the embodiment of a meter driving apparatus will now be explained.

When a pulse signal which corresponds to the rotation of a wheel is input from the input signal circuit 1, the rise of the pulse signal is detected by the rise detection circuit 21 and a transfer signal is first supplied to the counter 20 and a reset signal is then input to the counter 20 and the flip flop 23. When the counter 20 transfers the current count value to the memory 26 in accordance with the transfer signal, the counter 20 is reset by the reset signal and counts clock signals from the reference clock signal generator 3 until the next reset signal is input.

The counter 22 counts time and outputs a count signal at intervals of 20 msec asynchronously with the input pulse, thereby setting the flip flop 23. When a count signal is output in the state in which the flip flop 23 is set, the contents of the counter 20 are transferred to the memory 26. In accordance with the count signal of the counter 22, the frequency calculator 27 calculates the current frequency $f_i$.

In the state in which the frequency of the input pulse is very high, namely, the period is short, since the period from the time when the contents of the counter 20 are transferred with the detection of the rise of the pulse signal by the detection circuit 21 and the counter 20 is reset to the time when the next reset signal is input is shorter than the period for increasing the count value by the 20 msec counter 23, any output of the counter 20 is a signal output in accordance with the transfer signal before the reset of the counter 20. Therefore, the count value of the clock signals which corresponds to one period of the pulse signal, namely, data T for one period is stored in the memory 26.

The frequency counter 27 calculates 1/T to obtain the current frequency $f_i$ and inputs the frequency to the subtracter 28. The subtracter 28 also receives the precedent frequency $f_{i-1}$ at the other input and subtracts the precedent frequency $f_{i-1}$ from the current frequency $f_i$ to calculate the difference $f_d$.

The decision circuit 29 judges whether or not the output Q of the flip flop 23 is 0. When the frequency of the input pulse is high, the flip flop 23 is generally in the reset state. In this case, the signal Q=0 is output and the decision circuit 31 judges whether or not the absolute value of the difference $f_d$ is smaller than a predetermined value K while skipping the decision circuit 30.

If it is assumed that the indicator moves from a state in which the frequency of an input signal is small to a state in which the frequency of an input signal is large, in other words, to a state in which the indicator swings at a comparatively small angle to a state in which the indicator swings at a large angle, and the width of swinging rapidly increases, the answer of the judgement of the decision circuit 31 becomes NO. The difference renewing circuit 32 then calculates ⅛ of the difference $f_d$ and the adder 33 adds $f_d$ which corresponds ⅛ of the difference to the precedent frequency $f_{i-1}$ to obtain the current frequency $f_i$. In other words, the frequency $f_i$, which is closer to the target frequency merely by ⅛ of the difference than the precedent frequency is stored in the memory 34, and the frequency $f_i$ is output to the sin calculator 4, the cos calculator 5 and the quadrant decision circuit 10. Currents are applied to the drivers 8 and 9 in correspondence with the outputs of the sin calculator 4, the cos calculator 5 and the quadrant decision circuit 10, and the currents applied to the coils $L_s$ and $L_c$ generate the magnetic field in a predetermined direction, whereby the indicator swings to the position corresponding to the position closer to the target position by ⅛ of the difference than the precedent position.

When the 20 msec counter 22 outputs another count signal, the frequency calculator 27 calculates the frequency $f_i$ and the subtracter 28 calculates the difference $f_d$. Similarly, the decision circuit 29 judges whether or not Q=0, and the decision circuit 31 judges whether or not the absolute value of the difference $f_d$ is less than K. If the absolute value of the difference $f_d$ is not less than K, in other words, if there is a large difference between the precedent value and the target current value $f_i$, ⅛ $f_d$ is further obtained and the adder 33 further adds the difference $f_d$ to the precedent $f_{i-1}$ to obtain a new $f_i$. The memory 34 stores the new $f_i$ and outputs it to the sin calculator 4, the cos calculator 5 and the quadrant decision circuit 10 in the same way as in the precedent cycle.

This processing is repeated at the intervals of 20 msec so as to bring the indicator closer to the target by 1/8 of the difference, whereby the indicator is smoothly brought closer to the target value. When the difference $f_d$ becomes smaller than K at last, the answer of the judgement of the decision circuit becomes YES. In this case, the processing of the difference renewing circuit 32 for obtaining ⅛ of the difference is skipped and the current value $f_i$ is obtained by adding the precedent difference $f_{i-1}$ to the difference $f_d$ by the adder 33. The thus-obtained difference $f_i$ is stored in the memory 34 and is output as it is as the final indicating memory.

When the period of the current input pulse signal is very long, namely, the frequency is low, another count signal is output from the 20 msec counter 22 after the reset before the rise of the pulse signal, namely, the detection of one period is output by the rise detection signal 21, and with the increase of the count value of the 20 msec counter 22, the flip flop 23 is set at Q=1. In this state, the counter 22 outputs still another count signal, and a transfer signal is output through the AND circuit 24 and the OR circuit 25, so that the current count value is fictitiously regarded as the count value for one period and is stored in the memory 26 although the counter 20 has not yet counted the clock signals for one period. The frequency calculator 27 calculates the quasi-current frequency $f_i$ and the subtracter 28 calculates the difference $f_d$ between the precedent frequency and the current frequency. The decision circuit 29 judges whether or not the output Q of the flip flop 23 is 0. Since the flip flop 23 is set in this case, the signal Q=1 is output and the decision circuit 30 judges whether or not the difference $f_d$ is not less than 0. If the difference $f_d$ is not less than 0, it indicates that the current frequency is larger than the precedent frequency. In this case, since the indicator moves from 0 to a larger value, when the frequency is counted on the basis of the count value of the counter 20, which has not yet counted the clock signals for one period, $f_i$ obtained is apparently larger than the target frequency. Therefore, the difference $f_d$ is disregarded and the processing is finished.

However, in the case in which the flip flop 23 is set, for example, because the precedent frequency is high and the frequency of the input signal is low, the difference $f_d$ between the current frequency $f_i$ and the precedent frequency $f_{i-1}$ is negative. The answer for the judgement of the decision circuit 30 is therefore NO, and the decision circuit 31 judges whether or not the absolute value of the difference $f_d$ is not more than K. If the absolute value of the difference $f_4$ is very large, in other words, the frequency changes from a very high frequency to a very low frequency, and the swinging width of the indicator is intended to be made extremely small, the absolute value of the difference $f_d$ is reduced to ⅛ as a new difference $f_d$, and this $f_d$ is added to the precedent frequency $f_{i-1}$ to obtain the current frequency $f_i$ to be stored in the memory 34. In this case, since $f_d$ is negative, the new frequency $f_i$ is lower than the precedent frequency $f_{i-1}$, and a value intermediate between the target frequency and the precedent frequency is stored in the memory 34 and is also output to the sin calculator 4, the cos calculator 5 and the quadrant decision circuit 10.

The currents corresponding to the respective intermediate values flow to the coils $L_s$ and $L_c$ through the drivers 8 and 9, respectively, and the magnetic field is generated which instructs the indicator to point the value intermediate between the low frequency, which is the target value, and the high frequency, which is the precedent value. Since the indicator moves from the high frequency to the low frequency by ⅛ of the difference every time, continuous smooth movement of the indicator is realized.

Every 20 msec or every period after the output from the memory 34, the difference $f_d$ is calculated, and the difference $f_d$ is processed as ⅛ of the value while the absolute value of $f_d$ is not smaller than the predetermined K by the processings of the decision circuit 29, 34 and 31, whereby the indicator gradually comes closer to the target swinging angle by ⅛ of the difference.

According to the present invention, even if the frequency rapidly changes from a high value to a low value and the counter cannot respond to the count value for one period, a temporary output can be introduced from the current count value for the time being. Thus, the responsiveness is ensured. When the frequency changes to an extremely great extent, the value corresponding to the target frequency is not output immediately but predetermined values between the precedent output value and the current value are successively output, so that the indicator swings naturally.

In addition, even in the case in which the target frequency is low and a temporary frequency is counted from the count value which has not reached the count value for one period of the input pulse signal, if the difference is positive, the processing is finished and the calculated frequency is not output. Thus, it is possible to prevent the indicator from overrunning the target value and swing largely on the basis of the apparent frequency which is larger than the true value.

While there has been described what is at present considered to be a preferred embodiment of the invention, it will be understood that various modifications may be made thereto, and it is intended that the appended claims cover all such modifications as fall within the true spirit and scope of the invention.

What is claimed is:

1. A meter driving apparatus for indicating the value corresponding to an input corresponding:
   a clock signal generator for generating a reference clock signal;
   a counter for counting clock signals from said clock signal generator;
   a pulse signal inputting means for inputting a pulse signal of the frequency which corresponds to said input;
   a period-change detecting means for detecting a change of the period of said pulse signal which is input to said inputting means;
   a time counter for adding one to the current count value whenever a predetermined time has elapsed;
   a memory for storing the contents of said counter in response to a detection signal from said period-change detecting means or a count signal from said time counter;
   a calculator for calculating the digital value which is proportional to said input on the basis of the data stored in said memory in response to said count signal from said time counter;
   a difference calculator for calculating the difference between said digital value calculated by said calculator and the precedent digital value;
   a decision circuit for judging whether or not said digital value calculated by said calculator is a digital value which has been calculated on the basis of the data stored in said memory in response to said detection signal from said periodchange detecting means;
   a difference polarity decision circuit for judging whether said difference calculated by said difference calculator is positive or negative when the judgement of said decision circuit is NO;
   a difference value decision circuit for judging whether or not the absolute value of said difference is not less than a predetermined value when the judgement of said decision circuit is YES or when said difference is judged to be negative by said difference polarity decision circuit;
   an output decision circuit for outputting the digital value calculated by said calculator when the judgement of said difference value decision circuit is NO and outputting a predetermined value between said digital value calculated by said calculator and the precedent digital value when the judgement of said difference value decision circuit is YES;
   a driving means for energizing first and second exciting coils which are orthogonal to each other in correspondence with said digital value output from said output decision circuit; and
   an indicating means for indicating the direction at the angle determined by the torque received in accordance with the magnetic field generated by said first and second exciting coils.

2. A meter driving apparatus according to claim 1, wherein said time counter adds one to the current count value at the intervals of 20 msec.

3. A meter driving apparatus according to claim 1, wherein said output decision circuit includes:
   a difference renewing circuit for reducing the absolute value of said difference by ⅛ which is calculated by said difference calculator when the answer of the judgement of said difference value decision circuit is YES;
   an adder for adding said difference renewed by said difference renewing circuit or said difference calculated by said difference calculator to the precedent digital value; and
   a memory for storing said digital value with said difference added thereto by said adder as an output.

4. A meter driving apparatus according to claim 1, wherein said driving means includes:
   a sin calculator for calculating the sine of the digital signal output from said output decision circuit;
   a cos calculator for calculating the cosine of the digital signal output from said output decision circuit;
   pulse width modulators for modulating the pulse widths of the signals output from said sin calculator and said cosine calculator, respectively; and
   drivers for supplying the signals with the respective pulse widths modulated by said pulse width modulators to said first and second coils, respectively.

5. A meter driving apparatus according to claim 1, wherein said indicating means includes an indicator provided with a permanent magnet which receives a torque in accordance with a magnetic field generated by said first and second exciting coils.

6. A meter driving apparatus for indicating the value corresponding to an input comprising:
   a clock signal generator for generating a reference clock signal;
   a counter for counting clock signals from said clock signal generator;
   a pulse signal inputting means for inputting a pulse signal of the frequency which corresponds to said input;

a period-change detecting means for detecting a change of the period of said pulse signal which is input to said inputting means;

a time counter for adding one to the current count value whenever a predetermined time has elapsed;

a memory for storing the contents of said counter in response to a detection signal from said period-change detecting means or a count signal from said time counter;

a calculator for calculating the digital value which is proportional to said input on the basis of the data stored in said memory in response to said count signal from said time counter;

a difference calculator for calculating the difference between said digital value calculated by said calculator and the precedent digital value;

a decision circuit for judging whether or not said digital value calculated by said calculator is a digital value which has been calculated on the basis of the data stored in said memory in response to said detection signal from said period-change detecting means;

a difference polarity decision circuit for judging whether said difference calculated by said difference calculator is positive or negative when the answer of the judgement of said decision circuit is NO and finishing the processing if said difference is positive;

a difference value decision circuit for judging whether or not the absolute value of said difference is not less than a predetermined value when the answer of the judgement of said decision circuit is YES or when said difference is judged to be negative by said difference polarity decision circuit;

an output decision circuit for outputting the digital value calculated by said calculator as an output when the answer of the judgement of said difference value decision circuit is NO and outputting a predetermined value intermediate between said digital value calculated by said calculator and the precedent digital value as an output when the answer of the judgement of said difference value decision circuit is YES, said output decision circuit further comprising:

a difference renewing circuit for reducing the absolute value of said difference by $\frac{1}{2}$ which is calculated by said difference calculator when the answer of the judgement of said difference value decision circuit is YES;

an adder for adding said difference renewed by said difference renewing circuit or said difference calculated by said difference calculator to the precedent digital value;

a memory for storing said digital value with said difference added thereto by said added as an output;

a driving means for energizing first and second exciting coils which are orthogonal to each other in correspondence with said digital value output from said output decision circuit; and an indicating means for indicating the direction at the angle determined by the torque received in accordance with the magnetic field generated by said first and second exciting coils.

* * * * *